US006501697B1

(12) United States Patent
Perner et al.

(10) Patent No.: US 6,501,697 B1
(45) Date of Patent: Dec. 31, 2002

(54) HIGH DENSITY MEMORY SENSE AMPLIFIER

(75) Inventors: Frederick A. Perner, Palo Alto, CA (US); Andrew L. Van Brocklin, Corvallis, OR (US); Peter J. Fricke, Corvallis, OR (US); James R. Eaton, Jr., Palo Alto, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/976,304

(22) Filed: Oct. 11, 2001

(51) Int. Cl.[7] ................................................. G11C 7/02
(52) U.S. Cl. ........................ 365/209; 365/210; 365/158
(58) Field of Search .............................. 365/210, 207, 365/209, 158, 100, 148

(56) References Cited

U.S. PATENT DOCUMENTS

| | | | | |
|---|---|---|---|---|
| 5,091,888 A | * | 2/1992 | Akaogi .................. | 365/185.21 |
| 5,608,669 A | * | 3/1997 | Mi et al. ............... | 365/185.03 |
| 6,055,178 A | | 4/2000 | Naji ........................... | 365/158 |
| 6,169,686 B1 | | 1/2001 | Brug et al. ................. | 365/171 |
| 6,191,989 B1 | | 2/2001 | Luk et al. .................. | 365/207 |
| 6,233,189 B1 | * | 5/2001 | Tanzawa et al. ............ | 365/207 |
| 6,256,247 B1 | | 7/2001 | Perner ......................... | 365/209 |
| 6,259,644 B1 | | 7/2001 | Tran et al. .................. | 365/209 |
| 6,317,376 B1 | * | 11/2001 | Tran et al. .................. | 365/210 |
| 6,324,093 B1 | * | 11/2001 | Perner et al. ............... | 365/171 |
| 6,337,825 B2 | * | 1/2002 | Tanzawa et al. ............ | 365/207 |

OTHER PUBLICATIONS

TA 7.2—A 10ns Read and Write Non–Vaolatile Memory Array Using a Magnetic Tunnel Junction and FET Switch in each Cell, 2000 IEEE International Solid–State Circuits Conference.

7.6—A 256kb 3.OV 1T1MTJ Nonvolatile Magnetoresistive RAM, 2001 IEEE International Solid–State Circuits Conference.

* cited by examiner

*Primary Examiner*—Huan Hoang
*Assistant Examiner*—Gene N. Auduong (57) ABSTRACT

A sense amplifier is provided for reading data in a multiple-state memory cell of a resistive memory array in response to a read voltage applied across the sensed memory cell, including a differential amplifier having first and second input nodes. A sense circuit determines the current in the memory cell with the read voltage applied thereto and applies a sense current representative of the memory cell current to the first input node of the differential amplifier. A reference circuit has first and second resistive elements for applying a reference current to the second input node of the differential amplifier to provide a reference value against which to compare the sense current to determine the state of the memory cell. The first resistive element has a resistance representative of a first state of the memory cell, and the second resistive element has a resistance representative of a second state of the memory cell. A voltage source for applying the read voltage across the first and second resistive elements to generate a reference current by averaging the currents through the first and second resistive elements. A first translator transistor applies the sense current to the first node of the differential amplifier. A second translator transistor applies the reference current to the second node of the differential amplifier. A comparator circuit is used to compare the signals at the first and second input nodes of the differential amplifier to provide an output indicative of the state of the sensed memory cell.

20 Claims, 4 Drawing Sheets

HIGH DENSITY MEMORY SENSE AMPLIFIER

BACKGROUND OF THE INVENTION

1. Field of Invention

The present invention pertains to the field of memory sense amplifiers. More particularly, this invention relates to high-density memory sense amplifiers having a controlled sense voltage and a plurality of resistive elements providing a reference current.

2. Background

In a random access memory (RAM) array, an amplifier is used to sense the state of an addressed memory cell and provide a signal representing the sensed state to the output of the array. This sense amplifier takes different forms, depending on the type of RAM array. In a static random access memory (SRAM) array or dynamic random access memory (DRAM) array, the memory is often volatile, that is, not retaining the data when the array is powered off. Such memories are often complex and require complex sensing circuitry such as steering (decoder) circuits and clocked, current mode amplifiers.

In contrast, a non-volatile memory array, such as a cross-point array, utilizes very simple compact memory cells, such as the cross-point type, concerned with long-term retention, high density and fast access. A non-volatile array may be a write-once type having a fuse or anti-fuse at each cross-point cell, or a multiple read-write variety, such as a magnetic random access memory (MRAM) array having cross-point magnetic cells each capable of changing between two or more states.

A major problem in such high-density resistive memory arrays is the need to isolate a selected memory cell from the unselected cells to obtain accurate sensing of the cell state. The closeness and miniature size of the cells causes a significant problem with "parasitic" leakage current from unselected cells that interfere with the current from the selected cell. Moreover, the small sizes of the cells and the conductors result in smaller voltages and currents, resulting in the need for greater preciseness in measuring the currents and voltages to accurately determine the data in the cell.

For example, in MRAM arrays, typically the magnetic state of a selected cell, and therefore the data stored by the cell, is determined by a small difference in current through the selected cell at a row and column junction in the different cell states. Sensing the resistive state of a single memory cell can be unreliable because all memory cell junctions are coupled together through many parallel paths. The resistance sensed for any given memory cell equals the resistance of the sensed memory cell junction in parallel with resistances of the cells at junctions of the other rows and columns. Moreover, small differences inherent in sense amplifiers can lead to small differential voltages applied to a resistive cross point array when attempting to sense a selected memory cell. These small differential voltages can cause parasitic or "sneak path" currents that interfere with the sensing of the cell states. Thus, there is a need to isolate each selected cell from the unselected cells to obtain a true read of the cell data.

U.S. Pat. No. 6,256,247 B1 granted to Pemer on Jul. 3, 2001 discloses a read circuit for high-density memory arrays that includes a differential amplifier and two direct injection preamplifiers. The preamplifiers provide "equi-potential" isolation for the unselected cells by applying an equal voltage across input and output nodes of the cells, thus minimizing undesirable currents through unselected cells.

Another problem with high-density resistive memory arrays, such as arrays using MRAM cells, arises because the cell states are not measured by conductance or non-conductance, as in an anti-fuse memory. Rather the MRAM cell state is determined by minute differences in the conductivity of the cell junction causes by the change in resistance with different magnetic states. Thus, it is crucial to provide an accurate "mirror" of the sensed current from the cell to the sense amplifier, as well as to provide a means of measuring the sensed current against a reliable standard to determine the state of the cell.

One approach has been to use a reference memory array in which the memory circuit stores a single bit of information in one memory cell. The data is stored in the memory cell in one state and is compared to a reference cell in a known state. The cell information is read by detecting the difference in resistance between the memory cell and the reference cell. The sense scheme in this approach relies on including a series transistor with each memory cell and reference cell for isolation necessary for reliable sensing of data in the selected memory cells. An obvious disadvantage is that the effective area of a memory array is increased because of the need for series transistors in each reference cell and memory cell An example of this reference memory approach is shown in U.S. Pat. No. 6,055,178 granted to Naji on Apr. 25, 2000.

Another approach has been to use a pair of cells to store one bit of data. The data is stored in the memory cell in one state and in the other memory cell in the opposite state. The cell information is read by detecting the difference in resistance between the memory junctions of the pair of cells, called the "bit, bit bar" approach. The output from the cell pairs doubles the signal available for sensing, thus minimizing error. An obvious disadvantage is that the effective capacity of a memory array is cut in half because of the need for two memory cells for each stored bit. An example of this reference memory approach is shown in U.S. Pat. No. 6,191,989 granted to Luk on Feb. 20, 2001.

Accordingly, a practical circuit is needed for high-density resistive memory arrays to minimize the leakage currents from the unselected cells, such as by minimizing the voltage potential across the junctions of unselected cells. Moreover, there is a need to isolate the selected cell from the unselected cells so that any parasitic currents from unselected cells will not distort the accuracy of the selected cell current. In addition, it is important that slight differences inherent in different sense amplifiers be minimized to avoid distortions of the measured currents. Further, an accurate translation or mirroring of the sensed cell current must be provided to the sense amplifier in order to accurately measure the sensed current against a reference. Finally, an effective means of providing a reference current is needed which will not compromise the effective storage density of the array.

SUMMARY OF THE INVENTION

The present invention provides a practical circuit to integrate with a high-density memory. The circuitry of the present invention applies an accurate sense voltage to a selected cell and simultaneously to selected reference cells. It provides circuitry to apply "equi-potential" isolation to minimize the parasitic effects of leakage current from unselected memory cells. It provides a means to isolate the selected cell from the unselected cells. Further, the present invention provides an accurate reference for the sensed current without requiring an entire reference memory array. Moreover, the present invention provides access and sensing of resistive memory cells while maintaining read access times comparable to other high density sensing approaches.

In one preferred embodiment of the present invention, a sense amplifier is provided for reading data in a multiple-state memory cell of a resistive memory array in response to a read voltage applied across the sensed memory cell, including a differential amplifier having first and second input nodes. A sense circuit is provided for determining the current in the memory cell with the read voltage applied thereto and applying a sense current representative of the memory cell current to the first input node of the differential amplifier. A reference circuit is provided having first and second resistive elements for applying a reference current to the second input node of the differential amplifier, the reference current providing a value against which to compare the sense current to determine the state of the memory cell.

The first resistive element has a first resistance representative of a first state of the memory cell, and the second resistive element has a second resistance representative of a second state of the memory cell. A voltage source for applying the read voltage across the first and second resistive elements to generate a reference current by averaging the currents through the first and second resistive elements. A first translator transistor applies the memory cell sense current to the first node of the differential amplifier, and a second translator transistor applies the reference current to the second node of the differential amplifier. A comparator circuit is used to compare the signals at the first and second input nodes of the differential amplifier to provide an output indicative of the state of the sensed memory cell.

Another preferred embodiment of the present invention is a method of reading data in a sensed multiple-state memory cell of a resistive memory array using a differential amplifier. The method comprises generating a current in the memory cell using a read voltage applied thereto and applying a sense current representative of the current in the memory cell current to the first input node of the differential amplifier. A reference current is generated using a reference circuit with first and second resistive elements, and the reference current is applied to the second input node of the differential amplifier, the reference current providing a value against which to compare the sense current to determine the state of the memory cell.

The reference current is generated by generating a first reference current by applying the read voltage across a first reference element having a resistance representative of a first state of the memory cell, and generating a second reference current by applying the read voltage across a second reference element having a resistance representative of a second state of the memory cell.

The first and second reference currents are averaged, and the averaged current is applied to the second input node of a differential amplifier. A supply voltage is applied across a mirror transistor to the first node of the differential amplifier to generate a sense node voltage, and across a reference transistor to the second node of the differential amplifier to generate a reference node voltage. A first voltage is generated at the first node of the differential amplifier representative of the sense current, and a second voltage is generated at the second node representative of the reference current. The first and second voltages on the first and second input nodes of the differential amplifier are compared to provide an output indicative of the state of the sensed memory cell.

Other aspects and advantages of the present invention will become apparent from the following detailed description, which in conjunction with the accompanying drawings illustrates by way of example the principles of the present invention.

DETAILED DESCRIPTION OF THE INVENTION

Figure 1:
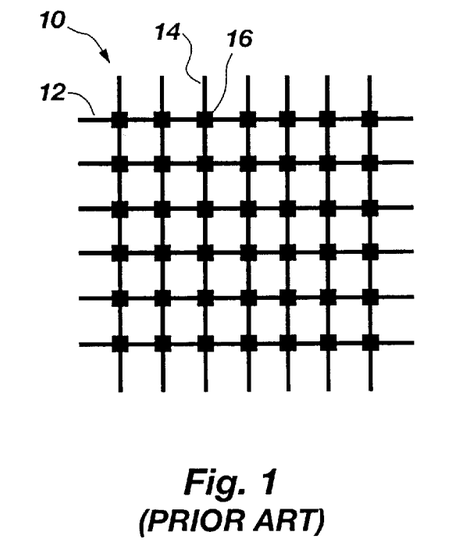
FIG. 1 is a schematic view showing a prior art resistive cross point memory device according to the present invention.

FIG. 1 shows a typical prior art cross-point memory array. The row conductors 12 running in one direction are referred to as the word lines, and the column conductors 14 extending in a second direction usually perpendicular to the first direction are referred to as the bit lines. The memory cells 16 are usually arranged in a square or rectangular array so that each memory cell unit 16 is connected with one word line 12 and an intersecting bit line 14.

In a resistive RAM array, the resistance of each memory cell has more than one state, and the data in the memory cell is a function of the resistive state of the cell. The resistive memory cells may include one or more magnetic layers, a fuse or anti-fuse, or any element that stores or generates information by affecting the magnitude of the nominal resistance of the element. Other types of resistive elements used in a resistive RAM array include poly-silicon resistors as part of a read-only memory, and floating gate transistors as part of optical memory, imaging devices or floating gate memory devices.

One type of resistive random access memory is a magnetic random access memory (MRAM), in which each memory cell is formed of a plurality of magnetic layers separated by insulating layers. One magnetic layer is called a pinned layer, in which the magnetic orientation is fixed so as not to rotate in the presence of an applied magnetic field in the range of interest. Another magnetic layer is referred to as a sense layer, in which the magnetic orientation is variable between a state aligned with the state of the pinned layer and a state in misalignment with the state of the pinned layer. An insulating tunnel barrier layer sandwiches between the magnetic pinned layer and the magnetic sense layer. This insulating tunnel barrier layer allows quantum mechanical tunneling current to flow between the sense layer and the pinned layer. The tunneling is electron spin dependent, causing the resistance of the memory cell to be a function of the relative orientations of the magnetizations of the sense layer and the pinned layer. The variations in the junction resistance for the two states of the sense layer determine the data stored in the memory cell. U.S. Pat. No. 6,169,686, granted to Brug et al. on Jan. 2, 2001 discloses such a magnetic memory cell memory.

Figure 2:
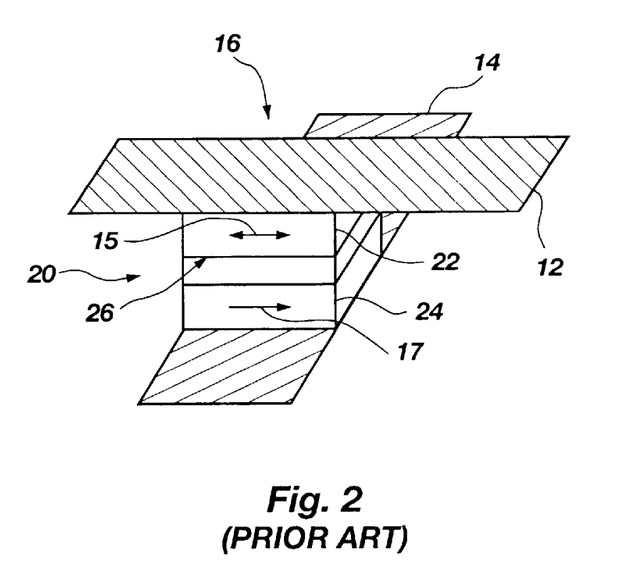
FIG. 2 is a schematic view showing the prior art structure of a MRAM memory cell and the conductors connected thereto.

Referring to FIG. 2, a MRAM memory cell is shown. Memory unit 16 is shown as a three-layer memory cell 20. In each cell 20 a bit of information is stored according to the orientation of a magnetic sense layer 22 of the cell 20. Usually, the cell 20 has two stable magnetic states corresponding to the logic states "1" and "0." The two-way arrow 15 on the sense layer 22 shows this binary-state capability. A pinned layer 24 in the cell 20 is separated from the sense layer by a thin insulator 26. Pinned layer 24 has a fixed magnetic orientation, such as shown by the one-way arrow 17 on layer 24. When the magnetic state of the sense layer 22 is oriented in the same direction as the direction of the magnetization of the pinned layer 24, the cell magnetization is referred to as "parallel." Similarly, when the magnetic state of the sense layer 22 is oriented in the direction opposite to the direction of the magnetization of the pinned layer 24, the cell magnetization is referred to as "anti-parallel." These orientations correspond to a low resistance state and a high resistance state, respectively.

The magnetic state of a selected memory cell 20 may be changed by applying currents to a word line 12 and a bit line 14 crossing the selected memory cell. The currents produce two orthogonal magnetic fields that, when combined, will switch the magnetic orientation of the sense layer of the selected memory cell 20 between the parallel and anti-parallel states. Other unselected memory cells receive only a magnetic field from either the word line or the bit line crossing the unselected memory cells. The single field is not strong enough to change the magnetic orientation of the sense layer of the unselected cells, so they retain their magnetic orientation.

Figure 3:
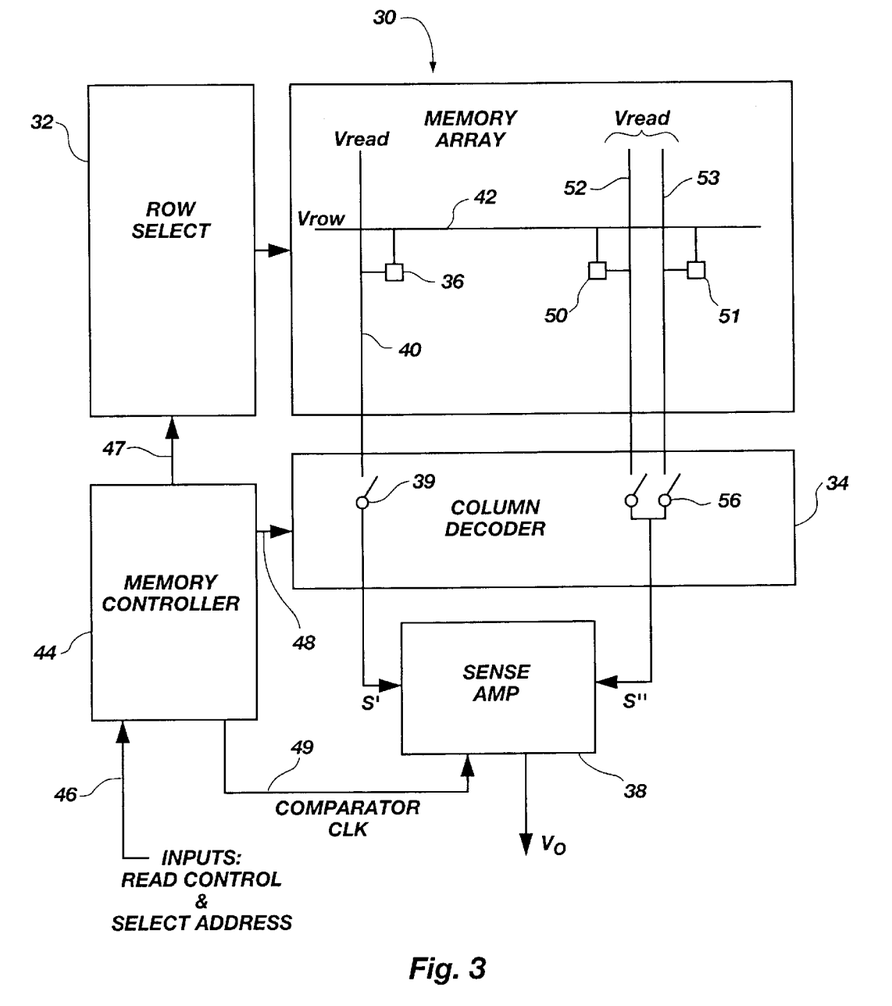
FIG. 3 is a schematic block diagram showing the structure of a MRAM memory cell array and sensing elements, according to the present invention.

FIG. 3 shows a cross-point resistive memory array 30 in accordance with the present invention. A row selector circuit 32 and a column decoder circuit 34 are connected to the memory array 30 to select a memory cell 36 by providing voltages on the appropriate row and column of cell 36. A sense amplifier 38 is connected through switch 39 in the column decoder circuit 34 to the bit line 40 of the selected memory cell 36. The row selector circuit 32 applies a voltage $V_{row}$ to the word line 42 of the selected memory cell 36, and a voltage $V_{read}$ is applied to the bit line 40. The same bit line voltage is applied to all of the unselected cells along bit line 40. However, the unselected cells receive a word line voltage $V_{row}$, such that they do not provide any substantial output current on the bit line 40. After selection of the memory cell, an amplifier A1 (see FIG. 4) in the sense amp 38 acts to hold column 40 to the voltage $V_{read}$.

A memory controller 44 receives read control and select address signals 46 and provides the appropriate row and column select signals to the row select circuit 32 and the column decoder circuit 34 on lines 47 and 48, respectively. A comparator clock signal 49 is applied to sense amplifier 38, for purposes to be explained.

As shown in FIG. 3, reference elements 50 and 51 are connected in parallel across word line 42. When the voltage $V_{row}$ selects memory cell 36 it also selects reference elements 50 and 51. After selection, an operational amplifier A2 (FIG. 4) in the sense amplifier 38 acts to hold columns 52 and 53 at read voltage $V_{read}$. Accordingly, reference elements 50 and 51 are subject to the same voltages applied to the selected memory cell 36.

The sense amplifier 38 receives a signal current at S' from cell 36 indicative of the data stored therein. Likewise, output signal currents at S" from reference elements 50 and 51 are applied through dual switch 56 to sense amplifier 38. In turn, sense amplifier 38 compares the sense current at S' from the memory cell to the reference current at S" and provides an output signal $V_O$ indicative of the data stored in memory cell 36.

Figure 4:
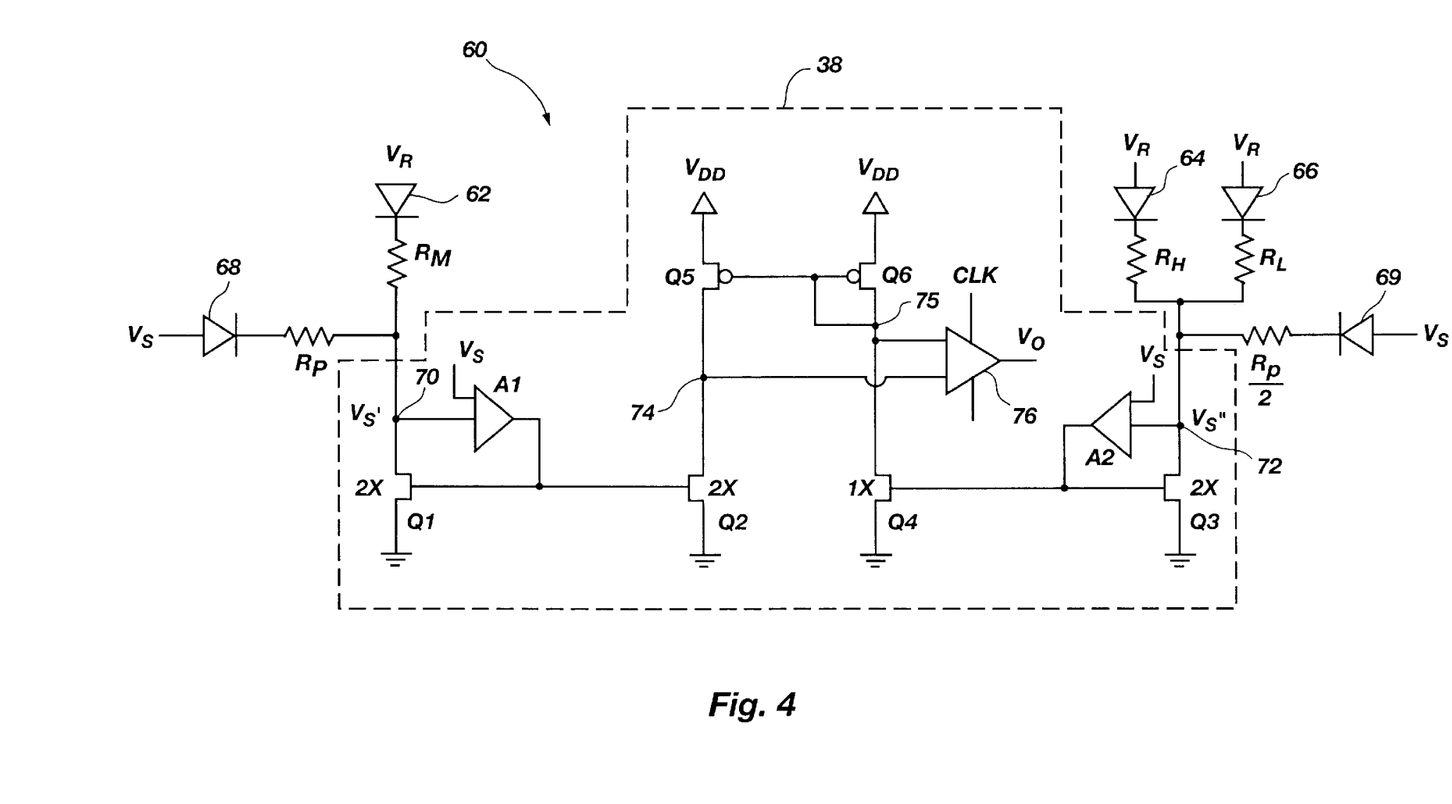
FIGS. 4 is a schematic circuit diagram showing the sense amplifier according to the present invention.

Looking now at FIG. 4, circuitry 60 includes sense amplifier 38 and other related circuitry components. The memory element $R_M$ is assumed to be a resistive device with at least two memory states indicated by high and low resistances and may be composed of two parts, a linear resistive part and a nonlinear resistive part. Each memory element $R_M$ is associated with a pair of reference elements $R_H$ and $R_L$ corresponding to the high and low resistance states of the memory element $R_M$. Amplifier 38 has a sense side (left side) concerned with determining the sense current through resistive element $R_M$ and a reference side (right side) providing a reference current from the current flowing through resistive elements $R_H$ and $R_L$.

Data is sensed by comparing a mirrored sense current through the selected memory cell to a mirrored averaged reference current. The mirrored sense current and the mirrored averaged current are generated in a similar manner. A sense voltage is applied to the sense and reference elements, and the resultant sense currents and reference currents flow through a set of current translation devices. In the reference current translation device, the $R_H$ and $R_L$ currents are summed, and the sum is divided by a factor approximately equal to two to form a mirrored averaged reference current. The output of the sense and averaged reference current translation devices is connected to a clocked, differential current comparator to complete the sense operation.

Describing the circuitry of FIG. 4 in more detail, the resistive elements $R_M$, $R_H$ and $R_L$ are each connected in series with nonlinear resistors, represented here by diodes 62, 64 and 66, respectively. The input to each diode is the read voltage VR. The combined parasitic resistance of a large number of unselected cells is represented by resistive element $R_P$, which is in series with a diode 68. An externally supplied voltage $V_S$ is applied to the diodes of all of the unselected cells. Likewise, on the reference side, external voltage $V_S$ is applied to an similar diode 69 which is connected in series with a resistive element Rp/2 representing the parasitic resistance from the two reference columns connecting the parasitic resistance to node 70. The output of the resistive element Rp/2 is connected to the output of resistive elements $R_H$ and $R_L$ at node 72 having a potential $V_S"$. The output of resistive element $R_P$ is connected to the output of resistive element $R_M$ at node 70 having a potential $V_S'$ A voltage control circuit is connected to node 70 to maintain the potential $V_S'$ as close to $V_S$ as possible. A transistor Q1 has its drain connected to node 70 and its source to ground. A high-gain operational amplifier A1 has $V_S$ as one input, with the feedback input connected to node 70. The output of amplifier A1 feeds into the gate of transistor Q1. The transistor Q1 and the amplifier A1 act to maintain the potential $V_S'$ at node 70 very close to the array voltage $V_S$.

An identical voltage control circuit is connected to node 72 at the output of parallel reference resistive elements $R_H$ and $R_L$. A transistor Q3 has its drain connected to node 72 and its source connected to ground. A high-gain operational amplifier A2 has $V_S$ as one input, with the feedback input connected to node 72. The output of amplifier A2 feeds into the gate of transistor Q3. The transistor Q3 and the amplifier A2 maintain the potential $V_S"$ very close to the array voltage $V_S$.

The sense current flowing through transistor Q1 is the sum of the current through the selected memory element $R_M$ and the parasitic currents flowing through the nearly zero biased diodes in series with the unselected cells, represented by diode 68 and resistive element $R_P$. With equi-potential isolation, where $V_S \cong V_S'$, and low leakage diodes, the parasitic current will be much less than the sense current through $R_M$.

The reference current flowing through transistor Q3 is the sum of the two currents flowing through the reference resistive elements $R_H$ and $R_L$ and the parasitic currents flowing through the nearly zero biased diodes in series with the unselected cells, represented by diode 69 and the resistive element Rp/2. The node 72 acts as a summing node for these two currents.

The gate of transistor Q1 is connected to the gate of a translator transistor Q2 that "mirrors" the sense current through transistor Q1 to a differential amplifier circuit, including transistors Q5 and Q6. The drain of transistor Q2 is connected to sense node 74, providing the mirrored sense current as an input to the differential amplifier described below.

Likewise, the gate of transistor Q3 is connected to the gate of a translator transistor Q4 that "mirrors" the reference current through transistor Q3 to the same differential amplifier circuit. A sizing ratio of the transistors Q3 and Q4 is approximately 2 to 1, so that the mirror current flowing in transistor Q4, referred to herein as the mirrored averaged reference current, is half of the sum of the two reference currents. The sizing ratio of the transistors Q3 and Q4 is determined by the physical properties of the circuits and devices and the ratio is adjusted to yield an optimum mirrored averaged reference current. The drain of transistor Q4 is connected to reference node 75, providing the mirrored averaged reference current as another input to the differential amplifier.

The sense voltages $V_S$ and the design of the voltage control circuits and current translator circuits described above are as close to identical on both the sense side and the reference side of the sense amplifier 38 to minimize the error in comparing the resistance of the memory element $R_M$ to the reference memory elements $R_H$ and $R_L$.

Transistors Q5 and Q6 and clocked amplifier 76 comprise a differential amplifier or clocked current comparator that is known in the art The sense current flows through Q1 and a mirrored sense current flows out of the drain of transistor Q5. The reference currents are summed and flow through transistor Q3 and a mirrored averaged reference current flows out of the drain of transistor Q6. If the mirrored sense current is greater than the mirrored averaged reference current, the voltage of sense node 74 will be pulled down below the voltage of reference node 75 and the output voltage of the clocked comparator amplifier 76 will go to a logic 0. If the mirrored sense current is less than the mirrored averaged reference current, the voltage of sense node 74 will be pulled above the voltage of reference node 75, and the output of the clocked comparator amplifier 76 will go to a logic 1.

Note that comparator amplifier 76 is clocked so that the voltages on nodes 74 and 75 can be sampled at times when the circuit has stabilized after a memory cell is sensed. The clocking function is preferably provided from an outside source 46, as shown in FIG. 3, that clocks the functions of the entire memory array.

One of the advantages of the present invention is that the sense amplifier circuitry provides a controlled sense voltage $V_S'$ and a controlled reference voltage $V_S''$, maintaining both voltages as near as possible to the array voltage $V_S$. This result minimizes the current flow through the unselected cells and helps to isolate the sense amplifier from the rest of the array. Typically, $V_S$ is selected fairly close to ground, perhaps at 100 millivolts, so that parasitic leakage currents are maintained as low as possible.

Another advantage of the present invention is the use of more than one reference element to provide an average current that may be adjusted to be a selected amount more than or less than the sense current, depending on the state of the memory cell. This approach is in sharp contrast to the "bit-bit bar" approach, where the resulting signal is likely to be double the value of the memory cell signal. One other advantage to the above-described approach of the present invention is that significantly smaller currents and voltages are needed in the memory array, thereby reducing the required power for the circuit, and the heat dissipation.

Another advantage of the present invention is that it reduces the number of memory elements required relative to a bit-bit bar design that requires approximately twice the number of memory elements in order to provide the necessary reference elements.

Figure 5:
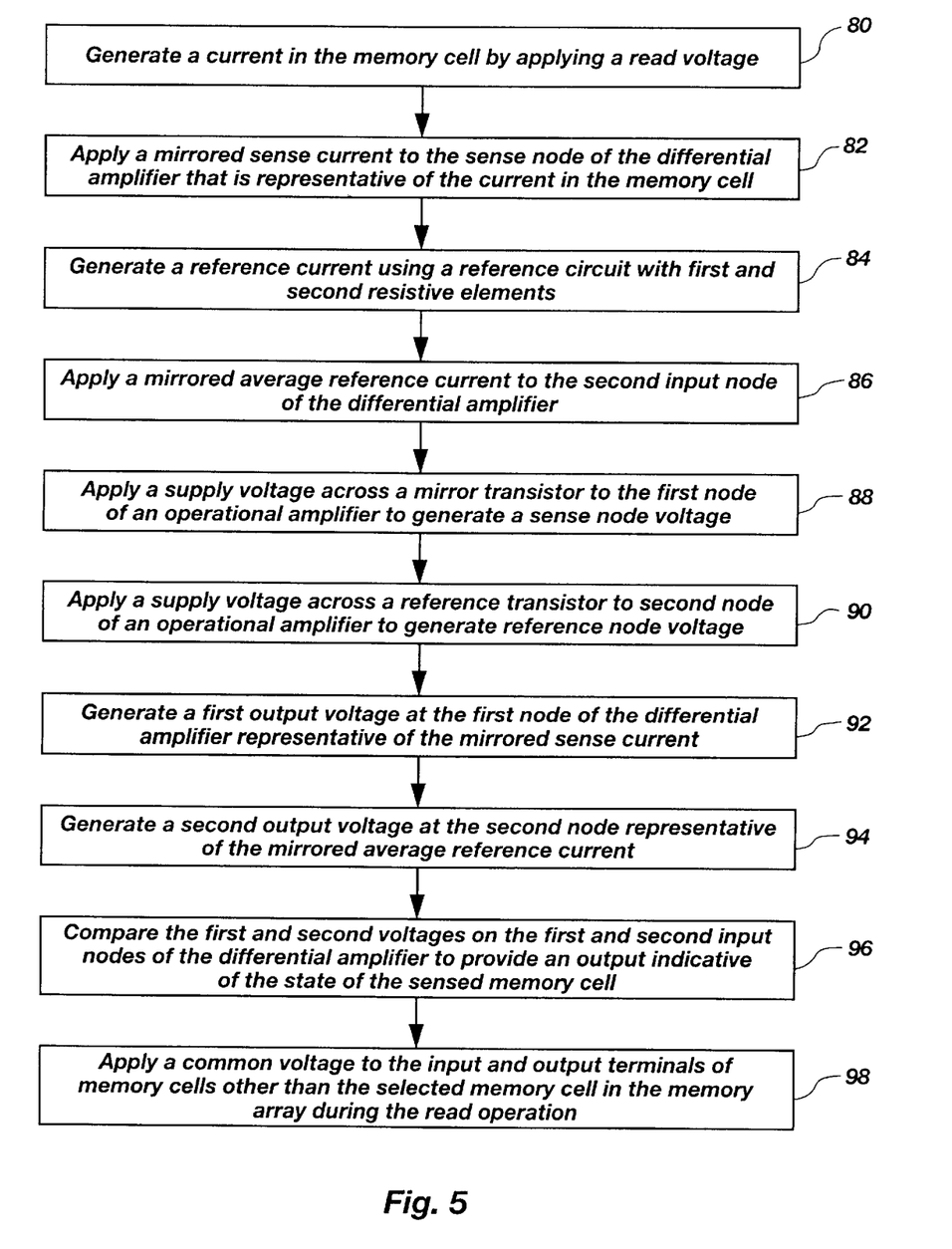
FIG. 5 is a flow chart of a method of sensing the resistance state of a memory cell according to the present invention.

Referring now to FIG. 5, a flow diagram is given, showing the main steps of a preferred embodiment of the invention. The diagram shows a method of reading data in a sensed multiple-state memory cell of a resistive memory array using a differential amplifier. At step 80, a current is generated in the memory cell using a read voltage applied thereto. Next at 82, a mirrored sense current is applied to the sense node of the differential amplifier that is representative of the current in the memory cell. At step 84, a reference current is generated using a reference circuit with first and second resistive elements. Next, at 86, the mirrored averaged reference current is applied to the second input node of the differential amplifier, the mirrored averaged reference current providing a reference value against which to compare the sense current to determine the state of the memory cell.

Although not shown in FIG. 5, the reference current may be generated by applying the read voltage across a first reference element having a resistance representative of a first state of the memory cell to generate a first reference current. The read voltage is applied across a second reference element having a resistance representative of a second state of the memory cell to generate a second reference current. The first and second reference currents are averaged to generate a mirrored averaged reference current that is applied to the second node of the differential amplifier.

As shown at step 88, a supply voltage is applied across a mirror transistor to the first node of the operational amplifier to generate a sense node voltage. At 90, a supply voltage is applied across a reference transistor to the second node of the operational amplifier to generate a reference node voltage. At step 92, a first output voltage is generated at the first node of the differential amplifier representative of the mirrored sense current, and at step 94 a second output voltage is generated at the second node representative of the mirrored averaged reference current. Step 96 comprises comparing the first and second voltages on the first and second input nodes of the differential amplifier to provide an output indicative of the state of the sensed memory cell. Finally, at step 98, a common voltage is applied to the input and output terminals of memory cells other than the selected memory cell in the memory array during the read operation, to minimize parasitic current in the memory array.

It is understood that the sense amplifier 38 can be adapted to a more general, multiple-bit per cell memory, where the resistive element could have three or more memory states and the sense amplifier 38 could have three or more reference states. It is also understood that single reference elements $R_H$ and $R_L$ could be used as a common reference for multiple memory cells. Thus, the circuitry of the present invention economizes greatly on effective storage in a memory array over the "bit-bit bar" memory array system. Moreover, the reference elements $R_H$ and $R_L$ may be either a part of the memory array, as shown in FIG. 3 or off site from the memory array, as part of the sense amplifier 38 or otherwise.

Although the above embodiments are representative of the present invention, other embodiments will be apparent to those skilled in the art from a consideration of this specification and the appended claims, or from a practice of the embodiments of the disclosed invention. It is intended that the specification and embodiments therein be considered as exemplary only, with the present invention being defined by the claims and their equivalents.

What is claimed is:

1. A sense amplifier for reading data in a multiple-state memory cell of a resistive memory array in response to a read voltage applied across the sensed memory cell, comprising:
   (a) a differential amplifier having first and second input nodes;
   (b) a sense circuit for determining the current in the memory cell with the read voltage applied thereto and applying a sense current representative of the memory cell current to the first input node of the differential amplifier; and
   (c) a reference circuit having first and second resistive elements for applying an averaged reference current to the second input node of the differential amplifier, the reference current providing a value against which to compare the sense current to determine the state of the memory cell.

2. The sense amplifier recited in claim 1, wherein the first resistive element has a first resistance representative of a first state of the memory cell, the second resistive element has a second resistance representative of a second state of the memory cell.

3. The sense amplifier recited in claim 1, and further comprising a voltage source for applying the read voltage across the first and second resistive elements to obtain the reference current.

4. The sense amplifier recited in claim 1, wherein the reference circuit is an averaging circuit for generating the reference current as an average of the currents through the first and second resistive elements.

5. The sense amplifier recited in claim 4, wherein the averaging circuit includes averaging elements for summing the currents through the first and second resistive elements to provide a summed current and dividing the summed current in half to obtain the average current.

6. The sense amplifier recited in claim 1, wherein the differential amplifier is a current mode differential amplifier.

7. The sense amplifier recited in claim 6, wherein the differential amplifier includes a current mirror sensing circuit having a mirror transistor coupled to the first input node and a reference transistor coupled to the second input node.

8. The sense amplifier recited in claim 7, and further comprising a comparator for comparing the signals at the first and second input nodes of the differential amplifier to provide an output indicative of the state of the sensed memory cell.

9. The sense amplifier recited in claim 1, and further comprising a first translator transistor for applying the sense current to the first node of the differential amplifier and a second translator transistor for applying the reference current to the second node of the differential amplifier.

10. The sense amplifier recited in claim 1, and further comprising a voltage source for applying a common voltage to the input and output terminals of the unselected memory cells in the memory array during the read operation, thereby minimize parasitic current.

11. A sense amplifier for reading data in a multiple-state memory cell of a resistive memory array in response to a read voltage applied across the sensed memory cell, comprising:
   (a) a differential amplifier having first and second input nodes;
   (b) a sense circuit for determining the current in the memory cell with the read voltage applied thereto and applying a sense current representative of the memory cell current to the first input node of the differential amplifier;
   (c) a reference circuit including a first element having a resistance representative of a first state of the memory cell, a second element having a resistance representative of a second state of the memory cell and a voltage source for applying the read voltage across the first and second elements; and
   (d) an averaging circuit for applying a reference current to the second input node of the differential amplifier, the reference current being the average of a first current through the first element with the read voltage applied thereto and a second current through the second element with the read voltage applied thereto.

12. The sense amplifier recited in claim 11, wherein the differential amplifier is a current mode differential amplifier.

13. The sense amplifier recited in claim 12, wherein the differential amplifier includes a current mirror sensing circuit having a mirror transistor coupled to the first input node and reference transistor coupled to the second input node.

14. The sense amplifier recited in claim 13, and further comprising a comparator for comparing the signals at the first and second inputs nodes of the differential amplifier to provide an output indicative of the state of the sensed memory cell.

15. A method of reading data in a sensed multiple-state memory cell of a resistive memory array using a differential amplifier, comprising:
   (a) generating a current memory cell using a read voltage applied thereto;
   (b) applying a sense current representative of the current in the memory cell current to the first input node of the differential amplifier;
   (c) generating a reference current using a reference circuit with first and second resistive elements; and
   (d) applying the reference current to the second input node of the differential amplifier, the reference current providing a value against which to compare the sense current to determine the state of the memory cell.

16. The method recited in claim 15, wherein the reference current is generated by generating a first reference current by applying the read voltage across a first reference element having a resistance representative of a first state of the memory cell, and generating a second reference current by applying the read voltage across a second reference element having a resistance representative of a second state of the memory cell.

17. The method recited in claim 16, wherein the reference current is generated by generating an average current from the first and second reference currents and applying the average current to the second input node of a differential amplifier.

18. The method recited in claim 15, and further comprising applying a supply voltage across a mirror transistor to the first node of the differential amplifier to generate a sense node voltage, and applying a supply voltage across a reference transistor to the second node of the differential amplifier to generate a reference node voltage.

19. The method recited in claim 15 and further comprising generating a first voltage at the first node of the differential amplifier representative of the sense current, generating a second voltage at the second node representative of the reference current, and comparing the first and second voltages on the first and second input nodes of the differential amplifier to provide an output indicative of the state of the sensed memory cell.

20. The method recited in claim 15, and further comprising applying a common voltage to the input and output terminals of memory cells other than the selected memory cell in the memory array during the read operation, to minimize parasitic current in the memory array.

* * * * *